US011790973B2

(12) United States Patent
Ware et al.

(10) Patent No.: US 11,790,973 B2
(45) Date of Patent: Oct. 17, 2023

(54) MEMORY COMPONENT WITH EFFICIENT WRITE OPERATIONS

(71) Applicant: Rambus Inc., San Jose, CA (US)

(72) Inventors: Frederick A. Ware, Los Altos Hills, CA (US); John Eric Linstadt, Palo Alto, CA (US); Brent Steven Haukness, Sunnyvale, CA (US); Kenneth L. Wright, Sunnyvale, CA (US); Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 140 days.

(21) Appl. No.: 17/376,032

(22) Filed: Jul. 14, 2021

(65) Prior Publication Data

US 2022/0005519 A1 Jan. 6, 2022

Related U.S. Application Data

(63) Continuation of application No. 17/099,413, filed on Nov. 16, 2020, now Pat. No. 11,069,392, which is a (Continued)

(51) Int. Cl.
*G11C 11/34* (2006.01)
*G11C 11/403* (2006.01)

(Continued)

(52) U.S. Cl.
CPC ............ *G11C 11/403* (2013.01); *G06F 12/06* (2013.01); *G11C 5/025* (2013.01); *G11C 7/1018* (2013.01);

(Continued)

(58) Field of Classification Search
CPC ....... G11C 7/1018; G11C 7/1045; G11C 7/00; G11C 7/1096; G11C 8/08; G11C 11/04; G11C 11/00; G11C 11/08; G11C 11/4085; G11C 11/409; G11C 11/4096; G11C 11/4091; G06F 12/06
See application file for complete search history.

(56) References Cited

U.S. PATENT DOCUMENTS 4,633,440 A 12/1986 Pakulski
5,570,320 A 10/1996 Runas (Continued)

OTHER PUBLICATIONS

EP Extended European Search Report dated Jan. 8, 2020 re: EP Appln. No. 17793279.5. 8 Pages.

(Continued)

*Primary Examiner* — Uyen Smet
(74) *Attorney, Agent, or Firm* — Lowenstein Sandler LLP

(57) ABSTRACT

A memory component includes a first memory bank. The first memory bank has a plurality of sub-arrays having sub-rows of memory elements. The memory component includes a write driver, coupled to the first memory bank, to perform a write operation of an entire sub-row of a sub-array. To perform the write operation, the write driver is to load a burst of write data to the memory bank. The memory bank may then activate a plurality of sense amplifiers associated with a plurality of memory elements of the entire sub-row to load the burst of write data to the plurality of sense amplifiers.

18 Claims, 8 Drawing Sheets

Receive a command at a memory component to perform a write operation 710
First or second write mode? 720
Second
First
Assert a wordline for a sub-row to sense data stored in a plurality of memory elements of the sub-row 750
Load write data to a specified subset of the plurality of associated sense amplifiers based on a address information 760
Transfer the data from the plurality of sense amplifiers to the plurality of memory elements 770
Load a burst of write data to a plurality of sense amplifiers associated with a plurality of memory elements of an entire sub-row 730
Assert a wordline for the sub-row after the burst of write data is load 740
Pre-charge the memory component 780

Related U.S. Application Data continuation of application No. 16/097,579, filed as application No. PCT/US2017/030902 on May 3, 2017, now Pat. No. 10,839,884.

(60) Provisional application No. 62/347,916, filed on Jun. 9, 2016, provisional application No. 62/330,979, filed on May 3, 2016.

(51) Int. Cl.

| | |
|---|---|
| ***G11C 11/4097*** | (2006.01) |
| ***G11C 11/4096*** | (2006.01) |
| ***G11C 8/08*** | (2006.01) |
| ***G11C 7/10*** | (2006.01) |
| ***G11C 7/18*** | (2006.01) |
| ***G11C 5/02*** | (2006.01) |
| ***G11C 11/408*** | (2006.01) |
| ***G06F 12/06*** | (2006.01) |
| ***G11C 11/406*** | (2006.01) |
| ***G11C 11/409*** | (2006.01) |
| *G11C 11/4091* | (2006.01) |

(52) U.S. Cl.

CPC .......... *G11C 7/1045* (2013.01); *G11C 7/1096* (2013.01); *G11C 7/18* (2013.01); *G11C 8/08* (2013.01); *G11C 11/408* (2013.01); *G11C 11/409* (2013.01); *G11C 11/4085* (2013.01); *G11C 11/4096* (2013.01); *G11C 11/4097* (2013.01); *G11C 11/40618* (2013.01); *G11C 11/4091* (2013.01)

(56) References Cited

U.S. PATENT DOCUMENTS

| | | | | |
|---|---|---|---|---|
| 5,691,955 | A | 11/1997 | Yamauchi | |
| 5,978,303 | A | 11/1999 | Takasugi et al. | |
| 6,108,243 | A * | 8/2000 | Suzuki | G11C 7/1039 365/220 |
| 6,188,377 | B1 | 2/2001 | Campbell et al. | |
| 6,288,928 | B1 | 9/2001 | Shinozaki | |
| 6,335,889 | B1 | 1/2002 | Onodera | |
| 2004/0057304 | A1 | 3/2004 | Smits | |
| 2005/0146974 | A1 | 7/2005 | Halbert et al. | |
| 2006/0092687 | A1 | 5/2006 | Kuhr et al. | |
| 2008/0219072 | A1 | 9/2008 | Breen et al. | |
| 2010/0008166 | A1 | 1/2010 | Kim et al. | |
| 2010/0195396 | A1 | 8/2010 | Higuchi | |
| 2010/0235714 | A1 | 9/2010 | Toda | |
| 2012/0251845 | A1 * | 10/2012 | Wang | G11B 5/66 428/827 |
| 2012/0294058 | A1 | 11/2012 | Best et al. | |
| 2012/0314520 | A1 | 12/2012 | Vogelsang et al. | |
| 2013/0254475 | A1 | 9/2013 | Perego et al. | |

OTHER PUBLICATIONS

Micron Technology, Inc., “DRAM: 1 MEG x 16 EDO DRAM”, Data Sheet, Revised Mar. 1997, pp. 1-24. 24 pages.

Notification Concerning Transmittal of International Preliminary Report on Patentability dated Nov. 15, 2018 re: Int’l Appln. No. PCT/US17/030902. 11 Pages.

Notification of Transmittal of the International Search Report and the Written Opinion of the International Searching Authority, or the Declaration dated Aug. 30, 2017 re: Int’l Appln. No. PCT/US2017/030902. 17 Pages.

CN Office Action dated Dec. 2, 2022 re: CN Appln. No. 201780012213.8. 11 pages. (W/translation).

* cited by examiner

MEMORY COMPONENT WITH EFFICIENT WRITE OPERATIONS

RELATED APPLICATIONS

This application is a continuation of U.S. patent application Ser. No. 17/099,413, filed Nov. 16, 2020, which is a continuation of U.S. patent application Ser. No. 16/097,579, filed Oct. 29, 2018, now U.S. Pat. No. 10,839,884, which is a National Phase Application of International Application No. PCT/US2017/030902, filed May 3, 2017, which claims the benefit of U.S. Provisional Application No. 62/347,916, filed Jun. 9, 2016, and claims the benefit of U.S. Provisional Application No. 62/330,979, filed May 3, 2016, the contents of all are incorporated by reference.

BACKGROUND

Memory devices, such as dynamic random access memory (DRAM) arrays, store data in memory elements. Accessing the data in memory elements may costs time and power resources. Some applications of memory devices may have power consumption constraints based on the environment of the memory device. Accordingly, memory architectures and operations that provide efficient access of memory elements may be used to limit power consumption for memory devices.

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Figure 1:
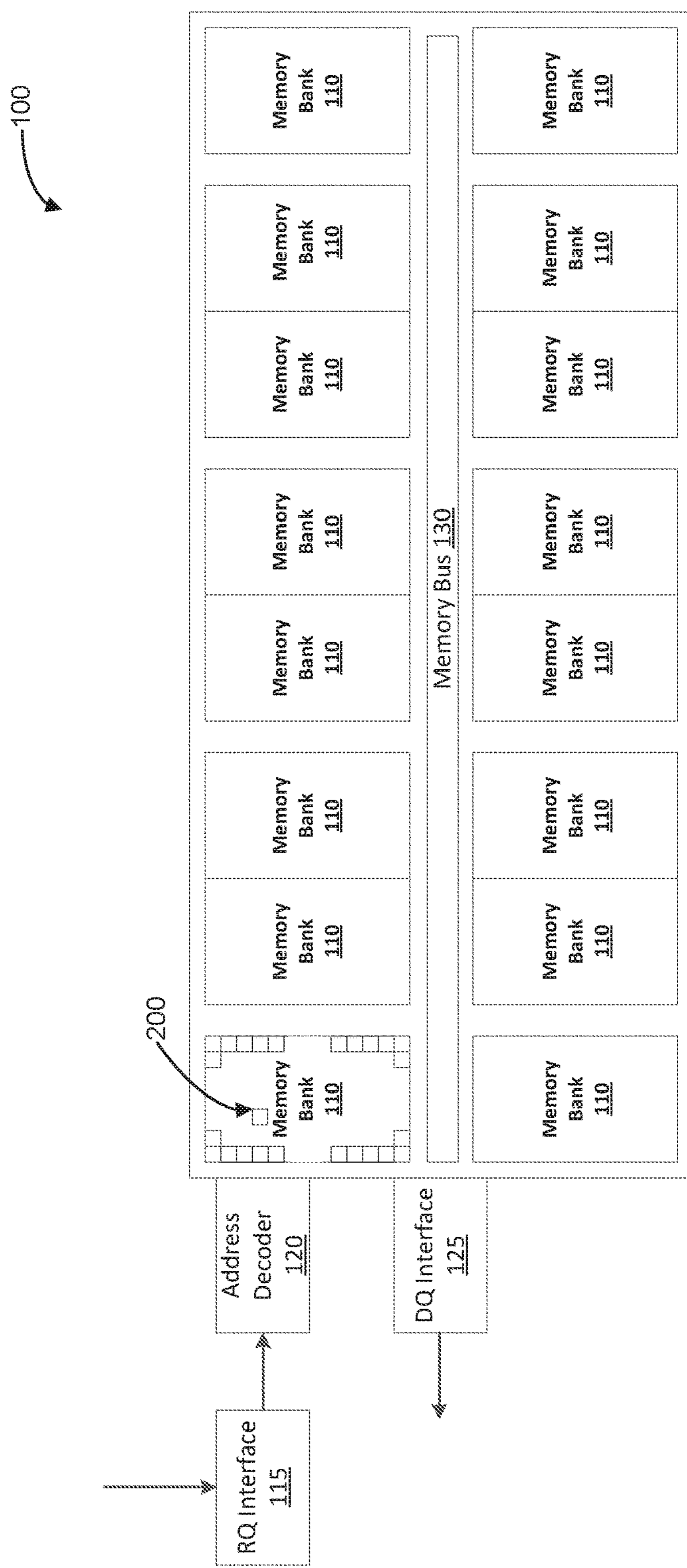
FIG. 1 is a block diagram of a memory device having a plurality of independent memory banks, according to an embodiment.

Efficient operation of memory devices may reduce total power consumption of the memory device, reduce heat generated by the memory device, or reduce access time for the memory device. Asserting unnecessary parts of a memory device to perform an operation or performing an unnecessary sense operation in connection with a write operation may increase power consumption. Thus, in one embodiment the device may be configured to perform a minimal set of operations, or a set of operations that consumes the least amount of power during operation. For example, when performing a write operation to an entire row or sub-row of memory elements, the data may be written without first sensing data from the memory elements.

A dynamic random access memory (DRAM) may include an array of memory elements arranged into rows and columns. Each memory element may be capable of storing one or more bits of data. The memory elements may be accessed by asserting a plurality of wordlines and bitlines coupled to the memory elements. For example, asserting a wordline and bitline corresponding to a memory element may present the information from the memory element to a sense amplifier. The sense amplifier may then amplify the data from the memory element and output it on a column line to a buffer. The data may then be returned from the buffer to a process that requested the data.

In some embodiments, a DRAM may have memory elements arranged into one or more sub-arrays that are individually addressable. For example, each sub-array may have a first level address that directs commands to a correct sub-array or set of sub-arrays. The sub-array may then be activated according to the command to access the addressed data. In some embodiments, memory operations may be performed at a sub-array as a page-mode access. Page-mode access refers to accessing an entire page of data at a time when performing memory operations. A page of data may be each element in a row of an array or each element in a sub-row of a sub-array.

In a DRAM memory device, accessing data from a memory element by asserting the wordline associated with it destroys the stored data. Thus, a read operation on a DRAM memory device may include operations of sensing data from a memory element at a corresponding sense amplifier, and then returning the data from the sense amplifier to the memory element. Data in the sense amplifier may then be provided to a memory bus. If the data is not returned to the memory element, then the data is lost. Similarly, in a page-mode read operation, the wordline associate with the page of data is asserted and the data from each element is sensed by a set of corresponding sense amplifiers. Data from addressed memory elements is provided to a memory bus through column lines, and the data is restored back to the memory elements.

In some embodiments, a DRAM memory device may also perform page-mode write operations. For example, in one mode of a page-mode write operation, a wordline may be asserted for the page to sense data stored in each memory element of the page at corresponding sense amplifiers. A write driver may then load write data to a subset of the associated sense amplifiers based on column addresses for the write data. For memory elements that are addressed by the write data, the sense amplifiers are driven to the new data value by the write driver and this value is transferred to the memory elements. For those memory elements that are not addressed by the write data, the sense amplifiers maintain the values sensed from the memory elements. Thus, the data transferred to the memory elements includes the write data for addressed memory elements and the original data sensed from the non-addressed memory elements.

In some embodiments, the memory device may perform a second mode of a page-mode write operation. The second mode of the page-mode write operation may be used in a situation where the size of the write data is the same as the size of the page. In the case that the size of the row or sub-row is the same as the size of the write data, the action of initially sensing the contents of the memory elements is unnecessary. Because each memory element is to be overwritten based on the size of the write data, sensing the memory data provides no additional information. Therefore, in the second mode of operation, the write data may be loaded into the sense amplifiers, and then the contents of the sense amplifiers may be transferred to the memory elements accessed by the asserted wordline. This may consume less power than the first mode of operation. For example, the power used to transfer the data from the memory elements to the sense amplifier is saved. In addition, to write data in the first mode, the write driver may override the data sensed by one or more of the sense amplifiers. Driving the sense amplifiers from an opposite state at the sense amplifier may consume more power than driving from a neutral state. Additionally, removing the action of initially sensing data from the memory elements may increase the speed of the memory operation.

In some embodiments, a memory device that performs the second mode of write operation may be used in applications that have low power consumption requirements. For example, mobile devices that have limited power availability may use the power savings to increase battery life or increase available power for other operations. In another application, a cryogenic computer may use reduced power consumption to maintain low temperature operation. For example, a cryogenic computer may operate processors in the range of 4 Kelvin. Associated memory devices may operate in the range of 77 Kelvin. At these low temperatures, each unit of power generated by a system may require 10 times that power to remove the generated heat and maintain the low temperature. Thus, reducing the power used by the memory device may greatly reduce the power used by the system to maintain operating temperatures. In some embodiments, other cryogenic computers may operate at other temperatures. For example, a cryogenic memory may operate at less than 80 Kelvin, between 0-10 Kelvin, between 10-100 Kelvin, or at other temperatures that enable a cryogenic processor to operate at a desired temperature.

In the following description, numerous specific details are set forth, such as examples of specific types of processors and system configurations, specific hardware structures, specific architectural details, specific system components, specific measurements, operations, etc. in order to provide a thorough understanding of the present implementations. It will be apparent, however, to one skilled in the art that these specific details need not be employed to practice the various implementations. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of memory systems may not be described in detail in order to avoid unnecessarily obscuring the described implementations. The following implementations are generally described with reference to components in DRAM memory devices, however, various implementations may be applicable to other types of memory devices as well.

FIG. 1 depicts a block diagram of a memory device 100 in accordance with an embodiment that provides a write mode to write an entire sub-row of a sub-array. For instance, the write mode may write a burst of data to an entire sub-row of a sub-array without first sensing the data from the memory elements in the sub-row. The memory device 100 may include an array of memory elements organized into individual memory banks 110. The example memory device 100 shown in FIG. 1 has 16 independent memory banks 110. In some embodiments, the memory device 100 may have fewer or additional memory banks 110. Each memory bank 110 may include a plurality of sub-arrays 200. The sub-arrays 200 may each include a plurality of memory elements. As an example, each sub-array 200 may have 512 sub-rows each having 576 memory elements. In some embodiments, the sub-arrays may have fewer or additional sub-rows. Furthermore, each sub-row may have fewer or additional memory elements. Each memory bank 110 may have independent address logic and local drivers to perform memory operations. For instance, each memory bank 110 may have column and row selection logic to select one or more memory elements for a particular memory operation. In some embodiments, a memory device 100 may include a single memory bank 110 or a memory bank 110 may include a single array that is not organized into sub-arrays 200.

The memory device 100 may include a memory request (RQ) interface 115 that receives memory requests from an associated computer system or processor. The RQ interface 115 may receive memory addresses and decode memory operations to perform from the memory requests. For instance, the RQ interface 115 may determine whether to perform a read or write operation, a memory bank 110 to perform the operation, and an address of the memory bank to perform the operation. The operations determined by the RQ interface 115 may be provided to the address decoder 120 such that the address decoder 120 can direct the memory device to select the rows and columns of one or more memory banks 110 addressed by the operation.

The address decoder 120 may activate one or more memory banks 110 and one or more sub-arrays 200 of a memory bank 110 to perform a memory access operation. In some embodiments, the address decoder may access the memory banks 110 through a memory bus 130. The memory bus 130 may include a plurality of through silicon vias (TSV) that transport signals to and from the memory banks 110. For instance, the memory bus 130 may provide signals to the memory bank 110 to perform a memory operation and receive data from the memory banks 110 to provide to a data (DQ) interface 125. The DQ interface 125 may receive data from one or more memory banks 110 through the memory bus 130. In some embodiments, the DQ interface 125 receives a control signal from RQ interface 115. The control signal may control transmission of read data accessed from one or more memory elements. Although the address decoder 120 is shown as operating to address individual memory banks, in some embodiments, individual memory banks may each have independent address decoders that decode addresses received from an RQ interface 115 through memory bus 130.

Figure 2:
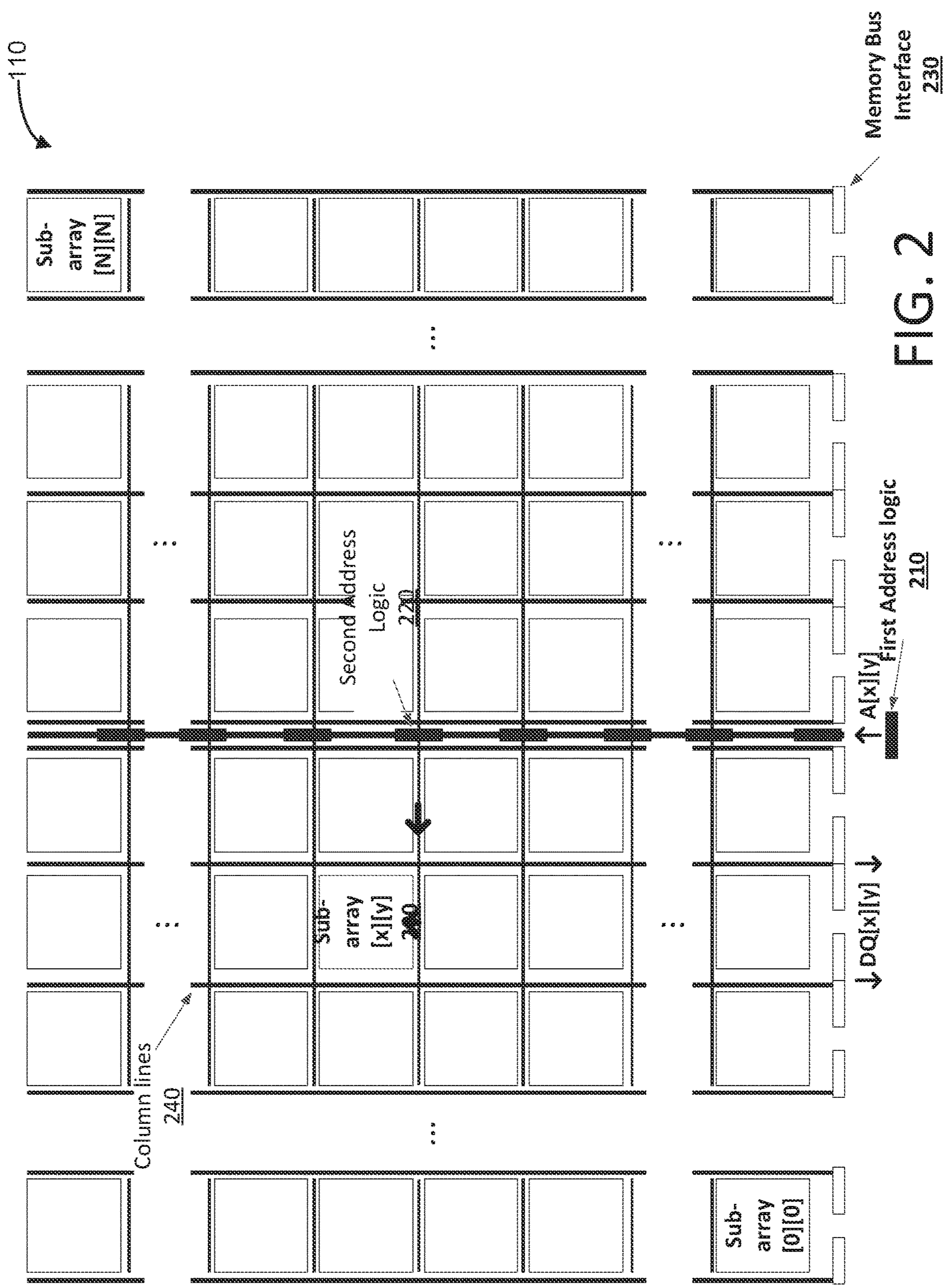
FIG. 2 is a block diagram of memory bank having a plurality of sub-arrays of memory elements, according to an embodiment

FIG. 2 depicts a block diagram of a memory bank 110 of a memory device. The memory bank 110 includes a plurality of sub-arrays 200, a memory bus interface 230, column lines 240, a first address logic 210, and a second address logic 220. During a memory operation, the memory device may access a subset of the sub-arrays 200 in order to reduce the energy required for each operation. For example, in a minimal case, the memory device may activate a single sub-array 200 to address memory elements of the sub-array 200. In FIG. 2, the memory bank 110 is an N×N array of sub-arrays 200. In some embodiments, the memory bank may be a 64×64 array of sub-arrays 200. In some embodiments, there may be fewer or additional sub-arrays 200 than shown in FIG. 2.

As shown in FIG. 2, the memory device may include first address logic 210, and second address logic 220. The first address logic 210 may receive an address A[x][y] at the memory bank 110 from an address decoder external to the memory bank 110. The address A[x][y] may indicate a particular sub-array [x][y] 200 to perform an operation and address particular memory elements within the sub-array 200. In some embodiments, row and column addresses for a memory access may be provided as a single address A[x][y] with a read or write command. In some embodiments, read or write addresses may be provided separately as individual addresses. The first address logic 210 may provide the address A[x][y] to second address logic 220. The second address logic 220 may then provide the address A[x][y] to the particular sub-array [x][y] 200 identified by the address A[x][y]. The address A[x][y] may include address information indicating a particular sub-array [x][y] 200 as well as memory elements within sub-array 200 that are addressed.

Memory bus interface 230 may provide write data to the memory bank 110 from a memory bus or may provide read data from the memory bank 110 to a memory bus. The memory bus interface 230, for example, may enable a particular sub-array 200 to receive data from and provide data to DQ interface 215 shown in FIG. 1. The memory bus interface 230 may provide data to or receive data from sub-arrays 200 through column lines 240. The column lines 240 shown in FIG. 2 are positioned between sub-arrays 200. However, in some embodiments, the column lines 240 may be positioned on top of sub-arrays 200 to increase the area available for routing column lines 240. Based on the increased area for routing column lines 240, the memory bank 110 may have more column lines 240 than if the column lines 240 were routed between sub-arrays 200. Increasing the column lines 240 available to communicate data between the memory bus and the sub-arrays 200 may increase the data width that can be provided by the sub-array 200. Having a larger data width compared to the page size of a sub-array 200 may increase the speed of data operations and reduce the energy required for a data operation.

Figure 3:
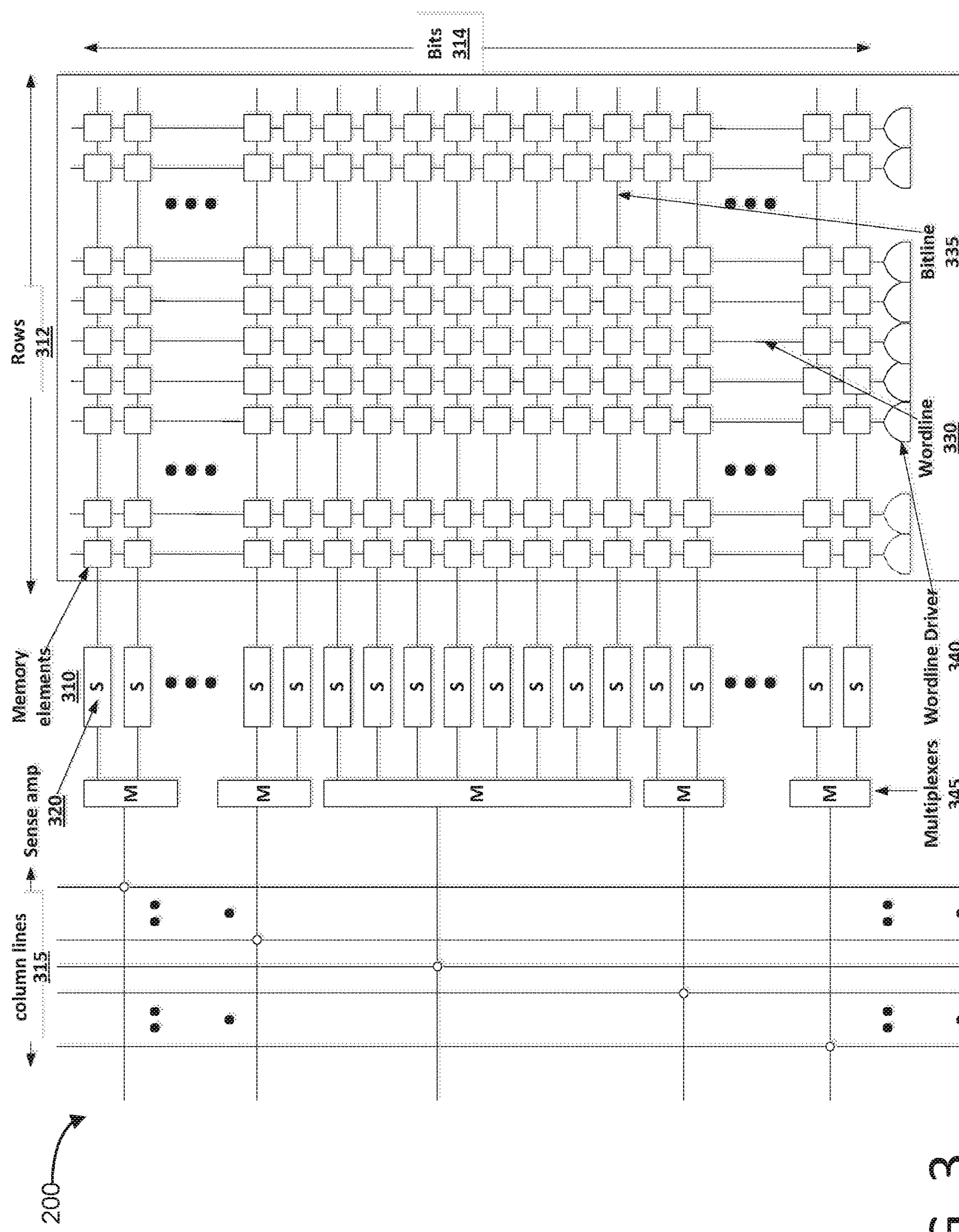
FIG. 3 is a block diagram depicting a portion of a memory sub-array, according to an embodiment.

FIG. 3 is a block diagram depicting a sub-array 200 of memory elements 310, according to an embodiment. The sub-array 200 depicted in FIG. 3 includes a plurality of memory elements 310. Each memory element 310 is coupled to an associated wordline 330 and bitline 335. Each wordline 330 may be coupled to an associated wordline driver 340. The wordline drivers 340 may assert an associated wordline 330 based on address information received from a memory controller or address decoder external to the sub-array 200. Bitlines 335 may couple each memory element 310 to an associated sense amplifier 320. The sense amplifiers 320 may be coupled to column lines 315 through multiplexers 345. Thus column lines 315 may provide data to and from memory elements 310.

The column block size for the sub-array 200 indicates the number of column lines in communication with the sub-array 200. In some embodiments, the column block size may be a large fraction of the row size. For example, the column block size may be ⅛ of the size of the page size of the sub-array 200. In such an embodiment, each column line may select data to and from 8 bitlines. In a particular embodiment, a sub-row of a sub-array 200 may have 576 bits and the memory device may provide 72 column lines 315 to the sub-array 200. Each column line 315 may then select data to an associated 8 bitlines of the sub-array 200. Data provided from the column line 315 to the sub-array 200 may be connected to the correct bitline 335 through a multiplexer 345. Similarly, data provided to the column line 315 from sub-array 200 may be received from the correct bitline 335 through multiplexer 345. Thus, multiplexer 345 may perform operations as a multiplexer or demultiplexer depending on whether there is a read or write operation.

A sense amplifier 320 may be provided for each bitline 335 of the sub-array 200. The sense amplifiers 320 may sense data from individual memory elements 310 in response to wordline driver 340 asserting the wordline 330 associated with a row of memory elements 310. During a read operation, the sense amplifiers 320 may then provide the data to column lines 315 through multiplexers 345. Sensing a memory DRAM memory element 310 destroys its contents, so the information in sense amplifiers 320 associated with sub-array 200 is written back to the activated row 312. Accessing a memory element for a write operation 310 includes activation, sensing, and overwriting an entire row 312 of memory elements 310 activated by a wordline 330. An entire row 312 is activated and sensed by sense amplifiers 320 before a column within the sub-array 200 is accessed, and the entire row 312 is overwritten or refreshed before it can be closed in preparation for a subsequent access. In some embodiments (not shown) sense amplifiers may alternate which side of a wordline they are located on. For example, sense amplifiers for memory elements on even wordlines may be located on the left side of the sub-array and sense amplifiers for odd wordlines may be located on the right side of the sub-array. Additional configurations of elements of the memory device may also be used.

Figure 4:
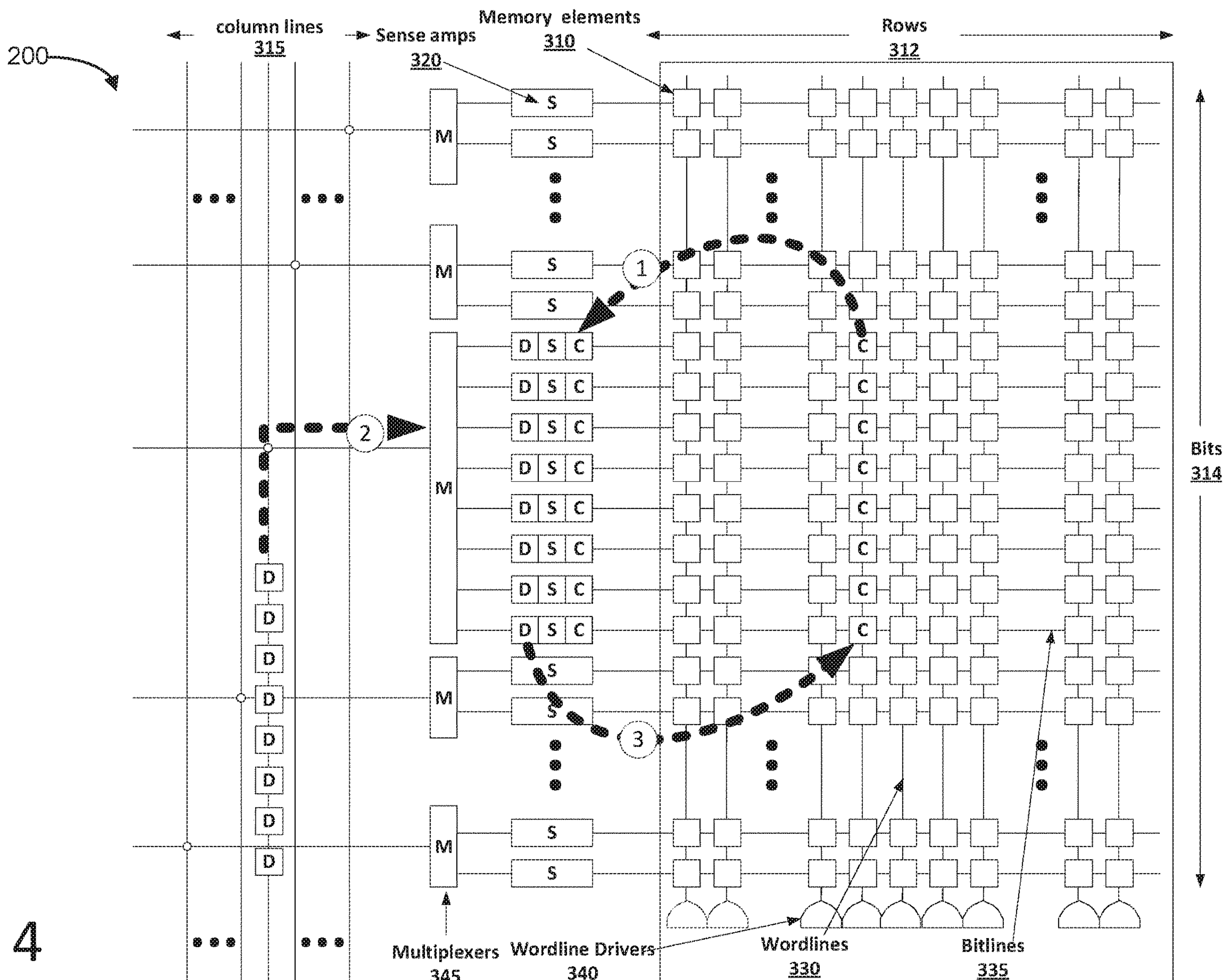
FIG. 4 is a block diagram depicting an operation of a memory array during a write operation, according to an embodiment.
Figure 5:
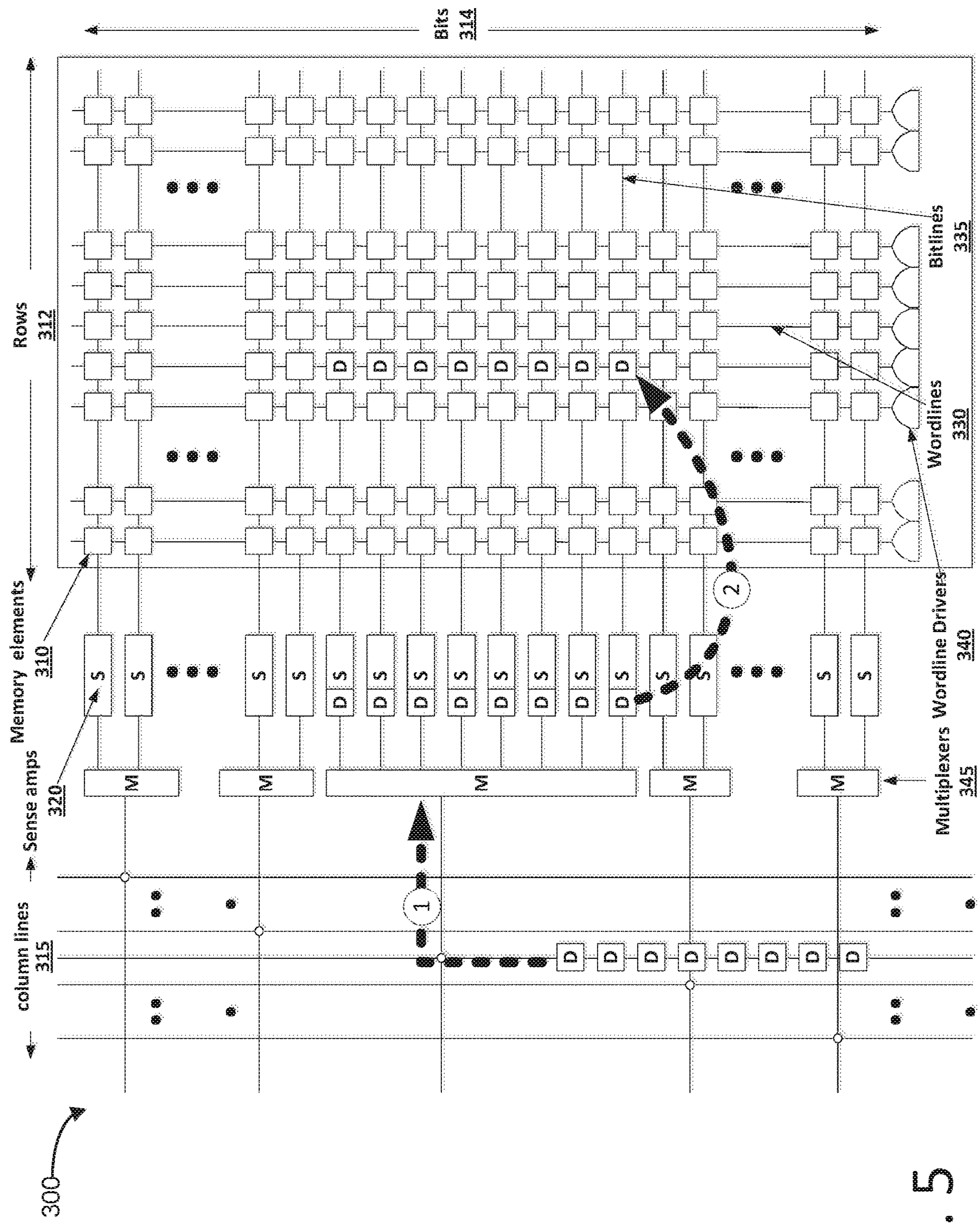
FIG. 5 is a block diagram depicting an operation of a memory array during a write operation, according to an embodiment.

FIGS. 4 and 5 are block diagrams depicting write operations performed by sub-array 200, according to an embodiment. FIG. 4 depicts write operations performed during a first mode write operation and FIG. 5 depicts write operations performed during a second mode write operation. The first mode write operation may be performed by a memory device in response to determining that the write operation is addressing fewer elements of a sub-array than an entire page. The second mode write operation may be performed by a memory device in response to determining that a write operation is addressing an entire sub-row of a sub-array 200. For example, the RQ interface 115 or address decoder 120 discussed with reference to FIG. 1 may determine whether to perform a write operation in the first mode or second mode. In some embodiments, the RQ interface 115 may receive a write operation with an indication of a write mode to use. For instance, the RQ interface 115 may receive an indication of the write operation to use from a memory controller external to the memory device.

In the first write mode depicted in FIG. 4, the sub-array 200 first senses data C from a row 312 of the sub-array 200 with sense amplifiers 320 in a first operation (1). The sense amplifiers 320 may sense the data C from row 312 in response to the wordline driver 340 asserting the wordline 330 coupled to the memory elements 310 in row 312. For example, asserting the wordline 330 may load data from memory elements 310 in a row 312 to corresponding sense amplifiers 320. The sense amplifiers 320 may then amplify the signals received from memory elements 310 to a recognizable logic level.

In a second operation (2) of the first write mode depicted in FIG. 4, the multiplexers 345 may receive a burst of write data D to write to memory elements 310. The burst of write data may be received by multiplexers 345 and written to sense amplifiers 320. Each element of write data D may be loaded to a sense amplifier 320 based on a column address for the write data. In the example shown in FIG. 4, the column lines 315 each address 8 bitlines. Therefore to write data to each sense amplifier 320 associated with those bitlines, the memory device may perform 8 column write cycles, one for each bit. As the column write cycles are performed, data C sensed by the sense amplifiers 320 is overwritten by write data D. During some operations, the memory device may not receive write data D for one or more memory elements 310. The sense amplifier 320, in that case, may retain the data C.

In a third operation (3) of the first write mode depicted in FIG. 4, the memory device transfers the data from the sense amplifiers 320 to the memory elements 310. For example, the sense amplifiers 320 may provide the charge from the sense amplifiers 320 to the memory elements 310 over bitlines 335. The charge from sense amplifiers 320 may then set the value of data in memory elements 310. The memory elements 310 may then each have states representing the write data D received by the memory device. Depending on the write data D, one or more memory elements 310 may have states representing sensed data C, if the write data D was not addressed to a memory element 310.

After the operations of the first write mode, the memory device may perform a pre-charge operation to charge the bitlines for a next operation. For example, the bitlines may be driven to a voltage level that is approximately half of the voltage corresponding to a logic high value of memory elements 310. The operations depicted in FIG. 4 are shown with reference to a single column line 315. However, the operations may be performed for each column line 315 that is provided to the sub-array 200. For example, each column line 315 may load one or more elements of write data D to corresponding sense amplifiers 320. In an example embodiment, the sub-array 200 may have 512 wordlines, 576 bitlines, and 72 column lines. Thus, each column line 315 may provide write data D to 8 bitlines 314 during operations of a first write mode. Furthermore, each sense amplifier 310 may sense data C from memory elements 310 in response to the wordline driver 340 asserting the wordline 330.

FIG. 5 is a block diagram depicting operations of a memory device during a second write mode. The second write mode may be used when performing a write to an entire sub-row of a sub-array. The operations of the second write mode may perform a write faster and consume less power than performing a write of the same data using the first write mode. For example, in the second write mode, the memory device may perform the write faster by removing the operation of initially sensing data from memory elements 310. The memory device may also consume less power by removing the possibility of overriding some data sensed by sense amplifiers 320. For example, if a sense amplifier 320 senses data from a memory element 310, but then has that data overwritten by write data, the energy required to drive the sense amplifier to the state of the write data is higher than if the sense amplifier 320 was at a pre-charged state. The power consumption savings are discussed further below with reference to FIGS. 6A and 6B.

The first operation (1) of the second write mode is to load a burst of write data D to sense amplifiers 320. The write data D may be loaded to each sense amplifier 320 in the memory sub-array 200. In the example embodiment shown in FIG. 5, the write data may be loaded to the sense amplifier through 8 column write cycles. Each column line 315 may perform 8 column write cycles to load data to 8 associated sense amplifiers 320.

After the burst of write data has been loaded to the sense amplifiers 320, the wordline driver may assert the wordline 330 associated with an addressed row 312. Asserting the wordline 330 stores the write data D from the sense amplifiers 320 to the memory elements 310. Because the wordline 330 is coupled to memory elements 310 for an entire sub-row of a sub-array 200, write data D may be stored to a memory element 310 for each bit in the sub-row.

After the operations of the first write mode, the memory device may perform a pre-charge operation to charge the bitlines for a next operation. For example, the bitlines may be driven to a voltage level that is approximately half of the voltage corresponding to a logic high value of memory elements 310. The operations depicted in FIG. 4 are shown with reference to a single column line 315. However, the operations may be performed for each column line 315 that is provided to the sub-array 200. For example, each column line 315 may load one or more elements of write data D to corresponding sense amplifiers 320. In an example embodiment, the sub-array 200 may have 512 wordlines, 576 bitlines, and 72 column lines. Thus, each column line 315 may provide write data D to 8 bitlines 314 during operations of a first write mode. Furthermore, each sense amplifier 310 may sense data C from memory elements 310 in response to the wordline driver 340 asserting the wordline 330.

The description with reference to FIGS. 4 and 5 references row operations within a single sub-array. However, the operations may be performed simultaneously to a plurality of sub-arrays of a memory device. For example, adjacent sub-arrays may share a common wordline that may be asserted by a wordline driver. Thus, performing a page-mode write operation, in the first or the second mode, may perform the operations on the memory elements associated with the wordline for both sub-arrays. In some embodiments, additional sub-arrays may be accessed by a common wordline. However operations may be more efficient when applied to a single sub-array or to a minimal set of sub-arrays to reduce the memory elements addressed and sense amplifiers that perform sense operations.

Figure 6A:
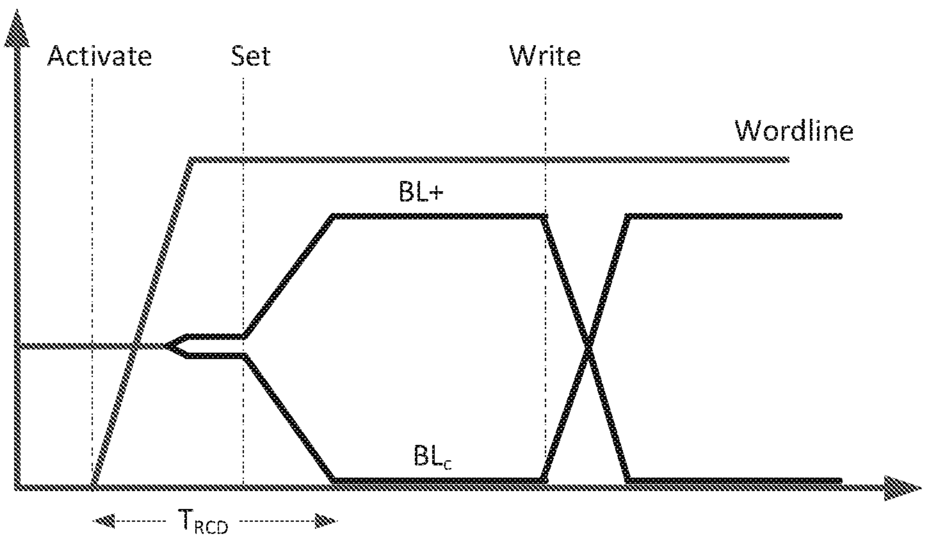
FIG. 6A is a timing diagram showing signals in a memory device during a write operation, according to an embodiment.
Figure 6B:
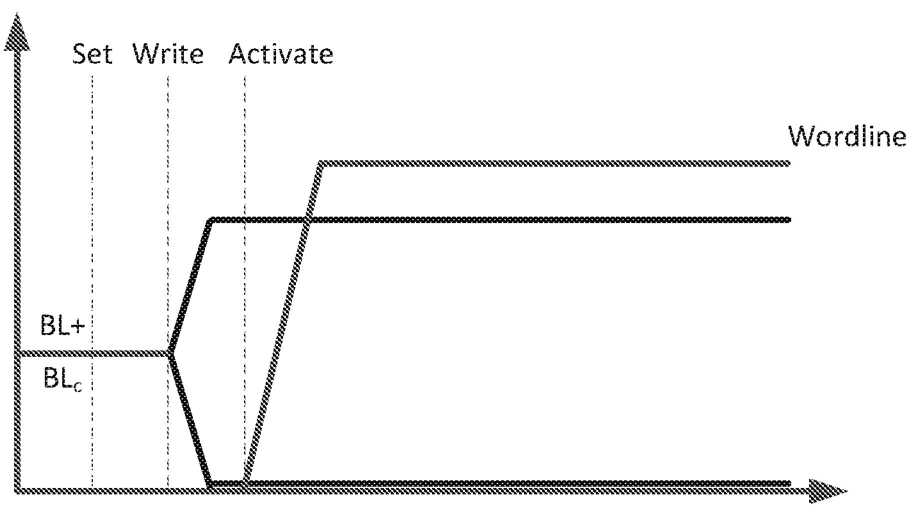
FIG. 6B is a timing diagram showing signals in a memory device during a write operation, according to an embodiment.

FIGS. 6A and 6B depict timing diagrams showing signals in a memory device during operation, according to an embodiment. The signals shown in FIGS. 6A and 6B are shown for a particular memory element. For example, the signals may be shown as they are applied to perform memory operations related to a single memory element 310 as shown in FIGS. 4 and 5. The signals shown in FIGS. 6A and 6B may not be to scale. For example, in some situations, there may be a delay as column write cycles are performed to load write data to other sense amplifiers than the sense amplifier performing the operations shown.

FIG. 6A depicts signals during operation of a memory element according to the first write mode discussed above with reference to FIG. 4. At the beginning of the sequence, the bitline charge at the sense amplifier is pre-charged to an initial level. For example, the sense amplifier may be pre-charged to a value of half a high logic value of the memory device. The wordline is asserted at the time referenced as "activate" in FIG. 6A.

When the wordline is activated, the charge stored at the memory element may be released to the sense amplifier. For example, the command that causes the wordline drive to activate the wordline of the addressed row may also include an activate command for the sense amplifier. The sense amplifier may then amplify the signal to recognized logic levels for the memory device. For example, between the time "activate" and "set" shown in FIG. 6A, the sense amplifier may sense the charge received from the memory element. For example, as shown in the figure, the charge at the sense amplifier may alter the state of the sense amplifier.

At a subsequent time "set" after a delay, the sense amplifier may amplify the received signal to a recognized value. The sense amplifier senses the state of the memory element so that the value may be returned to the memory element if incoming write data does not address the particular memory element.

In the example shown in FIG. 6A, the memory device then loads write data to the sense amplifier. For example, at time "write" a write driver may drive the sense amplifier to a state determined by the write data. In some situations, the incoming write data may be the same as the data sensed from the memory element. Then, the write driver may drive the sense amplifier to the state of the write data without consuming power to change the charge of the sense amplifier. In other situations, as shown in FIG. 6A, the write data may indicate a value opposite of the value sensed by the sense amplifier. As shown at time "write," the write driver must then drive the sense amplifier to the opposite state. As can be seen from the signals, the energy used to sense the data from a memory element is wasted in the case that the write data will override the data from the memory element. For example, instead of driving the sense amplifier from a pre-charged state to a value indicated by the write data, the write driver must drive the sense amplifier from an opposite state to the state indicated by the write data. The process shown in FIG. 6A may be performed for each bitline in a row asserted by the wordline driver. Therefore, the energy consumed sensing data from the memory elements and overriding those memory elements that have a value different than the write data is multiplied by the amount of data that is changed.

FIG. 6B depicts signals during operation of a memory element according to the second write mode discussed above with reference to FIG. 5. At the beginning of the sequence, the bitline charge at the sense amplifier is pre-charged to an initial level. For example, the sense amplifier may be pre-charged as discussed above with reference to FIG. 6A. The second write mode, as discussed above, does not sense data from memory elements prior to writing new data to the memory elements. Accordingly, the sense amplifier is not activated and set by assertion of wordline by the wordline driver. Furthermore, the memory device may not provide a separate activate command with the row address to cause the activation of the sense amplifiers with the wordline activation. Instead, the sense amplifier is set at time "set" without having sense data from a memory element. The write driver may then write data to the sense amplifier at time "write." Because the write driver is acting to drive the sense amplifier from a pre-charged state, the power consumed during the process is always the power to drive a voltage difference to recognized logic levels.

After the sense amplifier is driven to the value of the write data, the wordline driver may assert the wordline at time "activate." Asserting opens the memory elements of the corresponding row of memory elements to the bitlines coupled to the sense amplifiers. Thus, the charge from the sense amplifiers is transferred to the memory elements and stores the data from the sense amplifiers to the memory elements. In some embodiments, the timing in FIG. 6B may be performed differently. For example, write data may be loaded to the memory bank after the wordline is asserted. The write data may be loaded to the memory bank by the write driver and then the sense amplifiers may be activated so they set to the loaded write data. The write data may therefore be written to the sense amplifiers upon activation without the sense amplifiers having sensed data from the memory elements. However, the wordline may have been asserted prior to the write data being loaded to the sense amplifiers.

As can be seen from FIGS. 6A and 6B and the relevant description, the power consumed during the second write mode is less than the power consumed during the first write mode. In addition, the initial time to sense the data from the memory elements is saved. For example, as shown in FIG. 6A, the time $T_{RCD}$ (row to column cycle delay) can be saved during the memory operation because the sense operation is not performed. Based on the power consumption and time savings the second write mode may be performed in favor of the first write mode.

Figure 7:
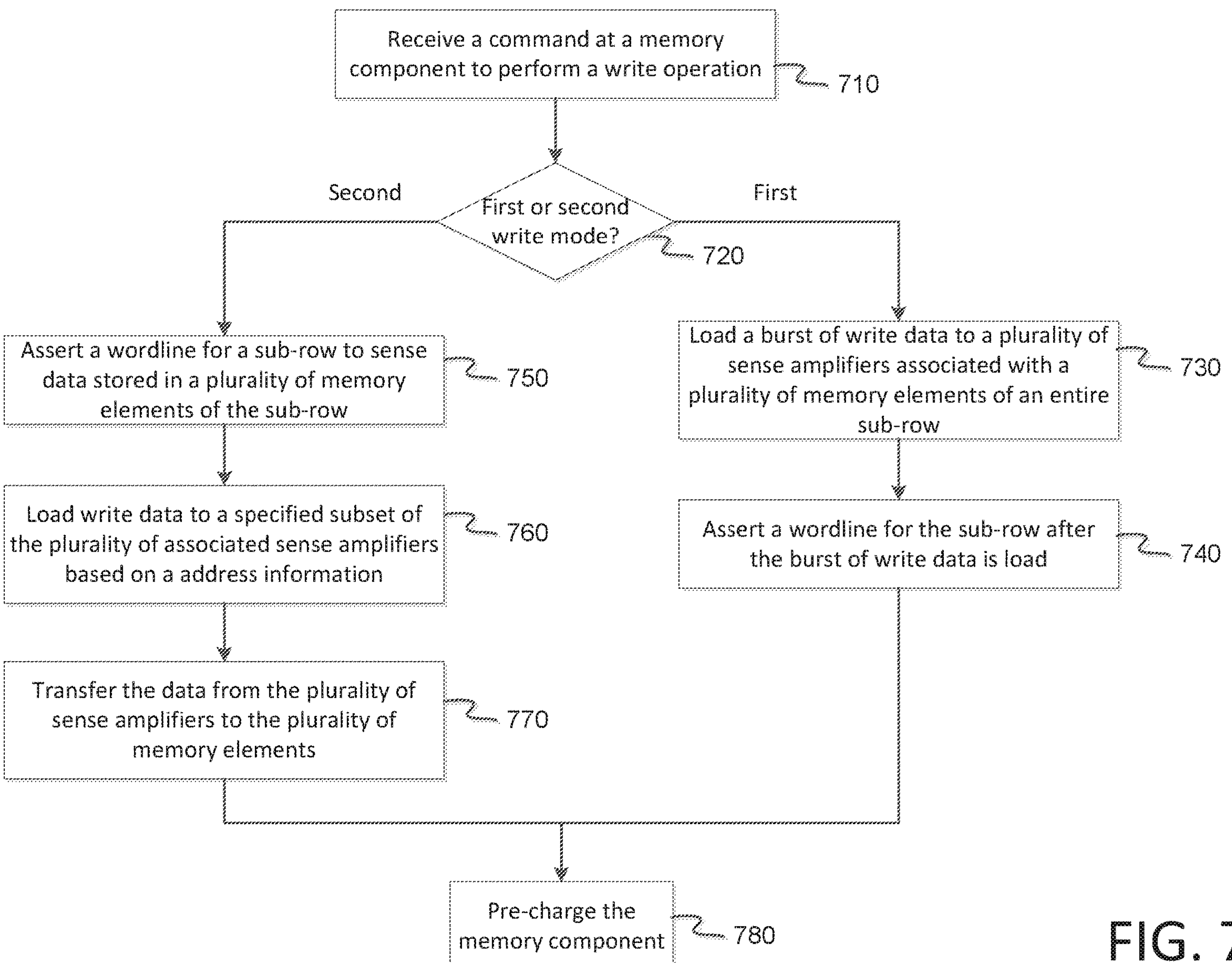
FIG. 7 is a flowchart depicting processes performed by a memory component during a write operation.

FIG. 7 is a flowchart depicting processes performed by a memory component during write operations, according to an embodiment. Beginning in block 710, the memory component receives a command to perform a write operation. In some embodiments, the command may be received by a memory controller coupled to one or more memory banks. The memory controller may then translate the command to access one or more memory banks. In some embodiments, the write operation may be received at an RQ interface that provides data and address information to an address decoder and memory banks.

In block 720, the memory component determines whether the operation specified is for the first write mode or for the second write mode. For example, the memory component may determine whether the write operation addresses an entire sub-row of the memory array or only a portion of a sub-row of a memory array. In some embodiments, the memory component may not make a determination based on the address of the received write command, but may make a determination based on a command decoder. For example, write data received by the memory component in block 710 may be received with a write command that indicates the first write mode or the second write mode. The first or second mode of the write command may be indicated by a bit in the write command. In that case, the determination of a mode in block 720 may be a decoding operation by a command decoder of the memory component.

If the memory component in block 720 determines to perform a write operation in a first mode, the method illustrated in FIG. 7 continues in block 730. In block 730, the memory component loads a burst of write data to a plurality of sense amplifiers associated with a plurality of memory elements of an entire sub-row of a sub-array. For example, a write driver of the memory component may provide write data from each of a plurality of column lines to the memory bank. The sense amplifiers may then be activated to load the write data to corresponding sense amplifiers. The sense amplifiers may then be driven to the state indicated by the write data.

After the write data is loaded to the sense amplifiers, in block 740 a wordline driver of the memory component may then assert a wordline associated with an addressed sub-row. In some embodiments, the wordline may be asserted before the write data is loaded to the sense amplifiers. Activating the sense amplifiers after the data is loaded to the memory bank may load the data to the sense amplifiers and then store the data to corresponding memory elements Asserting the wordline transfers the data loaded to the sense amplifiers to the memory elements. Because the memory elements were not sensed prior to loading write data to the sense amplifiers, any data stored in the memory elements prior to the write operation is destroyed. However, a memory controller may only use a first write mode operation when the write data is addressed to an entire sub-row of a sub-array of a memory component. Thus, any data stored in the addressed memory elements prior to the write operation would be destroyed even if the data was sensed prior to the write.

If the memory component determines in block 720 to perform the write operation in the second mode, then the method illustrated in FIG. 7 continues in block 750. In block 750, a wordline driver of the memory component asserts a wordline for a sub-row to sense data stored in a plurality of memory elements of the sub-row. For example, asserting the wordline may cause the charge from the memory elements to be transferred to a plurality of sense amplifiers. The sense amplifiers may then sense the charge from the memory elements and amplify the signal to a recognizable logic level.

In block 760, a write driver of the memory component loads write data to a specified subset of the plurality of sense amplifiers based on address information. For example, write data may be provided through a plurality of column lines to sense amplifiers associated with memory elements addressed by the write operation. For some sense amplifiers, the write data may reverse the polarity of the sensed data. Other sense amplifiers may receive write data that is the same as the sensed data or may not receive any write data. For those sense amplifiers that have the polarity reversed by the write data, the write driver may consume more power than if the sense amplifier had not sensed data from a memory element.

After the write data is loaded to the addressed sense amplifiers, the memory component may transfer the data from the plurality of sense amplifiers to the plurality of memory elements. The data may then be stored from the sense amplifiers to corresponding memory elements. After the write operation in the first mode or the second mode, the memory component may complete the operation by returning to a pre-charged state. For example, in a pre-charge state, the bitlines may be driven to a particular value to set the sense amplifiers for the next operation.

Figure 8:
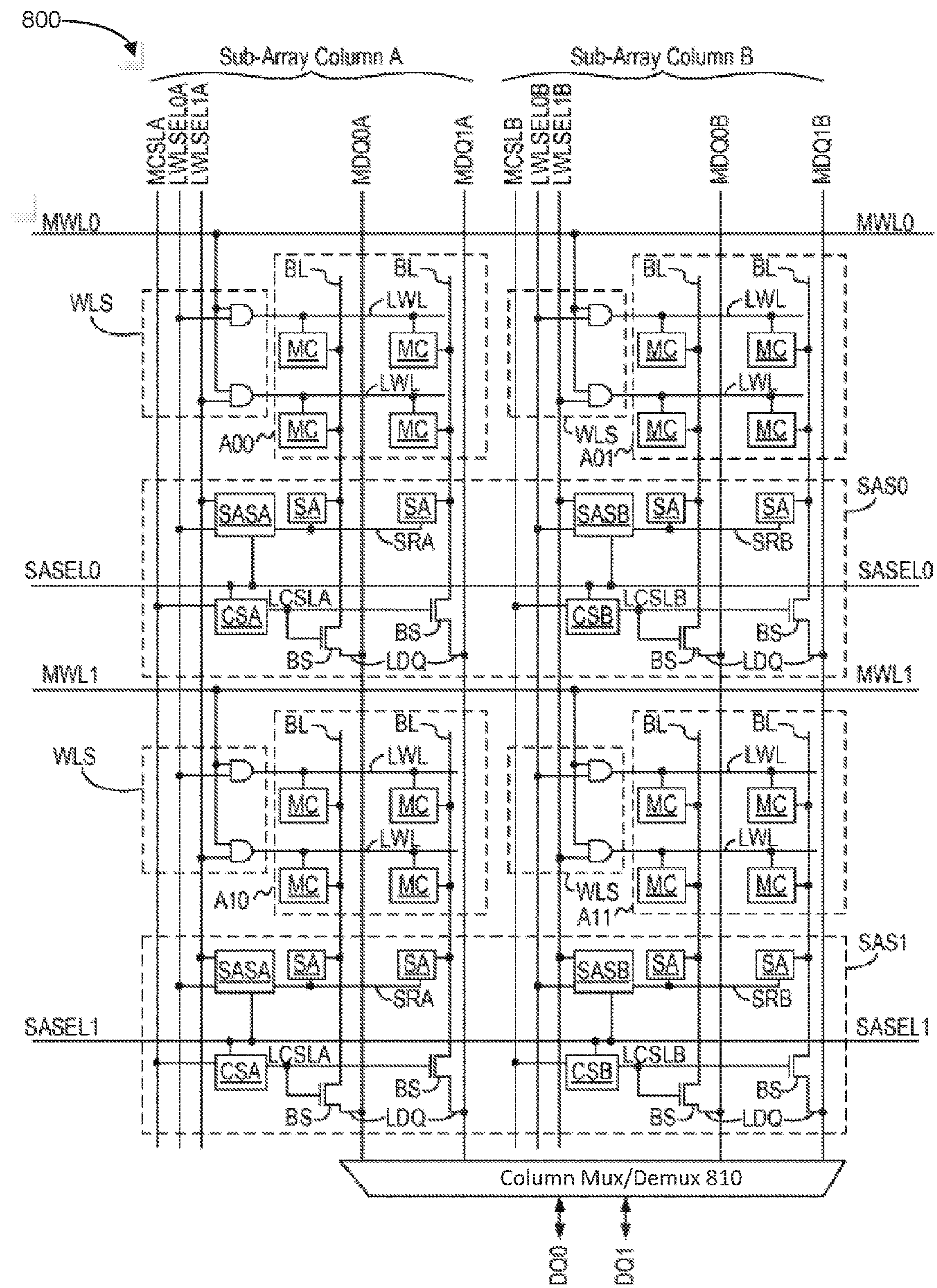
FIG. 8 is a block diagram showing components of a memory device to perform write operations as described herein, according to an embodiment.

FIG. 8 depicts a portion of a memory device 800 that supports access to a single sub-array during memory operations to reduce power consumption. The memory device 800 depicted in FIG. 8 shows additional details of memory elements and related components that may be used in memory components as described above with reference to FIGS. 1-5. The memory device in FIG. 8 enables operations to a sub-row of a memory array. In some embodiments, similar memory device may enable access to an entire row without enabling access to a single sub-row. However, such memory device may perform write operations to an entire row of data without first sensing data. Although FIG. 8 is shown with four sub-arrays each comprising four memory elements, various memory devices may have rows and columns of various sizes, depending on implementation. Practical memory devices may include far more sub-arrays, and far more memory elements per sub-array. Accordingly, FIG. 8 is simplified for ease of illustration.

The memory device 800 shown in FIG. 8 provides access to a single sub-array of a memory block. Accessing a single sub-array of a memory block may reduce the power consumed by a memory operation compared to accessing each sub-array in a row during access. A row in memory device 800 includes four memory elements MC, two in each of two adjacent sub-arrays (e.g., the topmost two memory elements in each of sub-arrays A00 and A01). Rather than accessing all four cells in one row, the memory device may access only two memory elements (referred to as one sub-row) in one of the two sub-arrays. To accomplish this, separate control signals are provided to the two sub-array columns A and B, each of which provides two-bit-wide data from one of the two constituent sub-arrays. For example, sub-array column A can produce two bits of data MDQ0A and MDQ1A from either sub-array A00 or A10. A column multiplexer/demultiplexer decodes row address information (not shown) to select between sub-array columns A and B when communicating two-bit data DQ0 and DQ1 to and from memory device 800.

With reference to the upper left sub-array A00, each row of memory elements MC is coupled to wordline select logic WLS via a common local wordline LWL, and each column of memory elements is connected to a corresponding sense amplifier SA via a respective bitline BL. To read a given memory element in sub-array A00, memory device 800 activates both memory elements MC in the selected row using the corresponding local wordline LWL, and thus presents the contents of the row of memory elements to the sense amplifiers. The sense amplifiers SA sense the row of data, and the contents of the one sense amplifier associated with the selected column is then read.

Control lines to sub-array column A convey a main column-select signal MCSLA and two local wordline select signals LWLSEL0A and LWLSEL1A. These signals control sense-amplifier-select logic SASA and column-select logic CSA in each of two sense-amplifier stripes SAS0 and SAS1. Select logic SASA issues a sub-row signal SRA that selectively enables a collection of sense amplifiers SA to communicate data between a row, or sub-row, of memory elements in sub-array A00 and two main data lines MDQ0A and MDQ1A. Control lines to sub-array column B similarly use a main column-select signal MCSLB and two local wordline select signals LWLSEL0B and LWLSEL1B to control sense-amplifier-select logic SASB and column-select logic CSB to communicate data between pairs of memory elements and two main data lines MDQ0B and MDQ1B. Sense amplifier stripes SAS0 and SAS1 are thus able to activate alternative sub-rows of memory elements, rather than an entire row, to communicate two bits of data. Memory device 800 selects between sub-array columns A and B based upon a decoded row-address (not shown), the same row-address multiplexer/demultiplexers 810 uses to select between pairs of main data lines.

The following discussion focuses on stripe SAS0 and memory sub-array A00. Wordline select logic WLS adjacent sub-array A00 selectively connects main wordline MWL0 to one of the two local wordlines LWL in sub-array A00. Asserting local wordline signals LWL in one sub-array opens a row of memory elements MC. Sense-amplifier select logic SASA asserts sub-row signal SRA responsive to select signal SASEL0 and one of local wordline select signals LWLSEL0A and LWLSEL1A. Sub-row signal SRA enables two sense amplifiers SA in stripe SAS0 to sense and amplify the data stored in the open row. Column-select logic CSA, responsive to sense-amplifier select signal SASEL0 and main column-select signal MCSLA, asserts a local column-select signal LCSLA to bit-select logic BS to connect the active sense amplifiers to main data lines MDQ0A and MDQ1A. Other embodiments can be configured or requested to provide both full-page and sub-row access.

In the embodiment of FIG. 8, all sensed memory elements MC connected to a given local wordline LWL are accessed. In a practical embodiment, it is likely that only a subset of such memory elements would be accessed. Such an embodiment can be modified to support sub-page access using additional column-select logic to select between sub-sets of local wordlines that together provide access to an entire page The power and time required for data access increases with increasing page size. Increasing data width for a given page size, or reducing page size for a given data width, therefore increases the speed and reduces the power required to access a given quantity of data. To this end, memory device 800 supports greater data widths for a given row size in order to reduce the power consumption and increase the speed of the memory device.

The architecture of the memory device 800 increases the data-width relative to row size for the memory device 800. For example, the relative placement of the main data lines MDQ0A and MDQ1A versus the main column-select lines MCSLA increase the space available for the data lines. Rather than extending the main data lines between the memory sub-arrays and the main column-select lines extend over the memory sub-arrays, in the embodiment of FIG. 8 the main data lines MDQ0A and MDQ1A extend over the memory sub-arrays A00 and A10, and the main column-select line MCSLA extend over the relatively narrow space between the sub-arrays. In general, the memory sub-arrays are considerably wider than the space that separates them, so routing the main data lines over the sub-arrays permits more main data lines, and consequently greater data widths for a given page size. Similar architecture is used for sub-array column B to provide the same data width.

In addition, the main data lines can extend over sense amplifiers SA, from a perspective perpendicular to the first and second axes (normal to the rows and columns of memory cells), for routing efficiency. From a layout perspective, each column-select logic CSA or CSB can be part of a WLS stripe, a sense-amplifier stripe, or both. The memory sub-arrays in the example of FIG. 8 are depicted as relatively small for ease of illustration; in practical embodiments, the sub-arrays are much larger relative to other device features. For example, the dimension of the memory sub-arrays along the first axis will generally be far greater than that of the WLS stripe. Routing all or most of the main data lines over the memory sub-arrays, rather than over the narrower WLS stripes, provides far greater routing areas for the main data lines and thus supports greater data widths for a given page size. As mentioned previously, increasing data width for a given page size, or reducing page size for a given data width, advantageously increases the speed and reduces the power required to access a given quantity of data The simplicity of the illustration of FIG. 8 clarifies several features of the depicted embodiment. Briefly, the arrangement of the data and column select lines, along with modifications to the sense amplifier stripes, allow the memory device to access relatively wider data from each sub-array than can be efficiently accessed using conventional hierarchical memory architectures. Extracting more data for each row access improves power efficiency, increases data bandwidth, or both.

In the above description, numerous details are set forth. It will be apparent, however, to one of ordinary skill in the art having the benefit of this disclosure, that some embodiments may be practiced without these specific details. In some instances, well-known structures and devices are shown in block diagram form, rather than in detail, in order to avoid obscuring the description.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "asserting," "transferring," "storing," "providing," "sensing," "obtaining," "receiving," "loading," "deleting," "executing," "requesting," "communicating," "determining," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring embodiments of the disclosure. Thus, the specific details set forth above are merely exemplary. Particular implementations may vary from these exemplary details and still be contemplated to be within the scope of the disclosure.

The description above includes specific terminology and drawing symbols to provide a thorough understanding of the disclosure. In some instances, the terminology and symbols may imply specific details that may not be required. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multiconductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits. A signal line is said to be "activated" when a signal is asserted on the signal line, and "deactivated" when the signal is de-asserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement. While the disclosure describes specific embodiments, it will be evident that various modifications and changes may be made thereto. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A memory device comprising:

a first sub-array having a plurality of sub-rows of memory elements;

a plurality of sense amplifiers associated with a plurality of memory elements;

a decoder coupled to the plurality of sense amplifiers, wherein the decoder is to:

receive a write command associated with a burst of write data;

determine that the write command is addressing an entire sub-row of a first sub-row of the plurality of sub-rows;

receive a second write command associated with a second burst of write data; and determine that the second write command is addressing less than an entire sub-row of a second sub-row of the plurality of sub-rows; and a write driver coupled to the first sub-array, wherein the write driver is to:

receive the burst of write data;

load the plurality of sense amplifiers with the burst of write data without previously sensing data stored at the memory elements in the first sub-row, responsive to a determination that the write command is addressing the entire sub-row of the first sub-row;

receive the second burst of write data; and load the plurality of sense amplifiers with the second burst of write data with previously sensing the data stored at the memory elements in the second sub-row.

2. The memory device of claim 1, wherein the write driver is further to:

load, based on a column address, the second burst of write data to a specified subset of the plurality of sense amplifiers, wherein the plurality of sense amplifiers are activated to sense the data previously stored in the memory elements in the second sub-row before the second burst of write data; and transfer the second burst of write data and a portion of the sensed data from the plurality of sense amplifiers to the memory elements of the second sub-row.

3. The memory device of claim 1, wherein the memory device consumes less power for the write command than the second write command.

4. The memory device of claim 1, further comprising a wordline driver, coupled to the first sub-array, to assert a wordline for the first sub-row after the burst of write data is loaded into the plurality of sense amplifiers, wherein asserting the wordline transfers the burst of write data from the plurality of sense amplifiers to the memory elements of the first sub-row.

5. The memory device of claim 1, wherein a row address and a column address for the write command are provided as a single command.

6. The memory device of claim 1, further comprising:

a first memory bank comprising the first sub-array and a second sub-array; and a wordline driver coupled to the first memory bank.

7. The memory device of claim 1, wherein the memory device is operable at a temperature of less than 80 Kelvin.

8. The memory device of claim 1, further comprising a plurality of column lines operatively coupled to the plurality of memory elements.

9. The memory device of claim 8, wherein the plurality of column lines are routed over the plurality of memory elements.

10. A method of operating a memory device, the method comprising:

receiving a write command associated with a burst of write data;

determining that the write command is addressing an entire sub-row of a first-sub row of a plurality of sub-rows of memory elements;

receiving the burst of write data;

loading a plurality of sense amplifiers with the burst of write data without previously sensing data stored at the memory elements in the first sub-row, responsive to a determination that the write command is addressing the entire sub-row of the first sub-row;

receiving a second write command associated with a second burst of write data;

determining that the second write command is addressing less than an entire sub-row of a second sub-row of the plurality of sub-rows;

receiving the second burst of write data; and loading the plurality of sense amplifiers with the second burst of write data with previously sensing the data stored at the memory elements in the second sub-row.

11. The method of claim 10, further comprising asserting, by a wordline driver, a wordline for the first sub-row after the burst of write data is loaded into the plurality of sense amplifiers, wherein asserting the wordline transfers the burst of write data from the plurality of sense amplifiers to the memory elements of the first sub-row.

12. The method of claim 11, further comprising pre-charging a plurality of bitlines associated with the first sub-row after the wordline is asserted.

13. The method of claim 10, further comprising determining that the write command is writing to each element of the plurality of memory elements based on a write activation signal indicating a write operation.

14. The method of claim 10, further comprising:

receiving a second write command to write a second burst of write data to a second sub-row;

activating a second plurality of sense amplifiers for the second sub-row to sense stored data in a second plurality of memory elements;

loading the second burst of write data to the second plurality of sense amplifiers; and transferring second data from the second plurality of sense amplifiers to the second plurality of memory elements.

15. The method of claim 10, further comprising:

receiving a second write command to write a second burst of write data to a second sub-row;

determining that the second write command is writing to less than all memory elements of the second sub-row based on a second write activation signal indicating an operation;

asserting a wordline for the second sub-row to sense data stored in a second plurality of memory elements to a second plurality of sense amplifiers associated with the second plurality of memory elements;

loading, based on a column address, the second burst of write data to the second plurality of sense amplifiers; and transferring the second burst of write data from the plurality of sense amplifiers to the plurality of memory elements.

16. A method comprising:

receiving a write command associated with a first burst of write data;

determining that the write command is addressing an entire sub-row of a first-sub row of a memory array;

loading a first plurality of sense amplifiers with the first burst of write data without previously sensing data stored at memory elements in the first sub-row, responsive to a determination that the write command is addressing the entire sub-row of the first sub-row;

transferring the first burst of write data from the first plurality of sense amplifiers to the first-sub row;

receiving a second write command to write a second burst of write data to a second sub-row of the memory array;

loading, responsive to the second write command, a second plurality of sense amplifiers with the second burst of write data with previously sensing data stored at memory elements of the second sub-row; and transferring the second burst of write data from the second plurality of sense amplifiers to the second sub-row.

17. The method of claim 16, further comprising:

determining that the second write command is writing to less than all memory elements of the second sub-row based on a second write activation signal; and asserting a wordline for the second sub-row to sense data stored in the memory elements of the second sub-row to the second plurality of sense amplifiers, wherein loading the second burst of write data comprises loading the second burst of write data based on a column address.

18. The method of claim 16, wherein determining that the write command is addressing the entire sub-row of the first-sub row is based on a write activation signal.

* * * * *